(12) United States Patent
Joo

(10) Patent No.: US 7,663,918 B2
(45) Date of Patent: Feb. 16, 2010

(54) NONVOLATILE MEMORY DEVICE AND METHOD OF PROGRAMMING/READING THE SAME

(75) Inventor: Seok Jin Joo, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 11/292,430

(22) Filed: Dec. 2, 2005

(65) Prior Publication Data
US 2006/0152977 A1    Jul. 13, 2006

(30) Foreign Application Priority Data
Jan. 12, 2005  (KR) ............... 10-2005-0002828

(51) Int. Cl.
    *G11C 11/34* (2006.01)
(52) U.S. Cl. .................... 365/185.11; 365/185.17
(58) Field of Classification Search ........... 365/185.11
    See application file for complete search history.

(56) References Cited

U.S. PATENT DOCUMENTS

| | | | |
|---|---|---|---|
| 5,790,457 A | * | 8/1998 | Kim et al. ............ 365/185.17 |
| 6,285,587 B1 | * | 9/2001 | Kwon ................... 365/185.11 |
| 6,418,059 B1 | | 7/2002 | Kreifels et al. |
| 6,570,781 B1 | * | 5/2003 | Lee et al. ...................... 365/63 |
| 6,597,605 B2 | | 7/2003 | Kreifels et al. |
| 6,714,456 B1 | | 3/2004 | Ogura et al. |
| 6,803,630 B2 | | 10/2004 | Pio et al. |
| 2004/0165438 A1 | * | 8/2004 | Chevallier ............ 365/185.11 |

FOREIGN PATENT DOCUMENTS

| | | |
|---|---|---|
| JP | 2000-222895 A | 8/2000 |
| KR | 100197553 B1 | 2/1999 |
| KR | 10-2001-0003655 A | 1/2001 |
| TW | 200421349 | 10/2004 |
| TW | 200427071 | 12/2004 |

* cited by examiner

*Primary Examiner*—Hoai V Ho
*Assistant Examiner*—Jason Lappas
(74) *Attorney, Agent, or Firm*—Townsend and Townsend and Crew LLP

(57) ABSTRACT

A nonvolatile memory device includes a first memory block including a plurality of memory cells provided between a first drain selection transistor and a source selection transistor; and a second memory block including a plurality of memory cells provided between a second drain selection transistor and the source selection transistor. The first and second memory blocks share the same source selection transistor that is supplied with a voltage via a source selection line.

9 Claims, 5 Drawing Sheets

FIG. 1B
(PRIOR ART)

| LINE | PROGRAM VOLTAGE | READ VOLTAGE |
|---|---|---|
| SELECTED WL | 17~19V | 0V |
| DESELECTED WL | 10V | 4.5V |
| DSL | VCC | 4.5V |
| SSL | 0V | 4.5V |
| CSL | VCC(or 0V) | 0V |
| SELECTED BL1 | 0V | 1V |
| DESELECTED BL2 | VCC | 0V |
| BULK | 0V | 0V |

FIG. 2B

| BLOCK | LINE | PROGRAM VOLTAGE | READ VOLTAGE |
|---|---|---|---|
| 2n | SELECTED WL | 17~19V | 0V |
| | DESELECTED WL | 10V | 4.5V |
| | DSL1 | VCC | 4.5V |
| | SELECTED BL | 0V | 1V |
| | DESELECTED BL | VCC | 0V |
| 2n+1 | WL | 0V | 4.5V |
| | DSL2 | 0V | 4.5V |
| | BL | 0V | 0V |
| BULK | | 0V | 0V |
| SSL | | 0V | 4.5V |

NONVOLATILE MEMORY DEVICE AND METHOD OF PROGRAMMING/READING THE SAME

BACKGROUND OF THE INVENTION

1. Field of the Invention

The present invention relates to nonvolatile memory devices and more particularly, to a NAND flash memory device sharing source selection transistors to which a voltage is applied through a source selection line for dual-memory block.

2. Discussion of Related Art

NAND flash memory devices, as electrically erasable and programmable nonvolatile memory devices, are widely used in portable computers, personal digital assistants, mobile phones such as cellular phones, computer BIOS chips, printers, universal serial buses, and so on. A memory cell of the flash memory device is electrically programmable and erasable with a thin oxide film (hereinafter, referred to as "tunnel oxide film") about 100 Å in thickness, in which electrons move by a strong electric field and a threshold voltage varies to initiate programming and erasing functions.

FIG. 1A is a circuit diagram of a conventional NAND flash memory device, and FIG. 1B shows voltage conditions during programming and reading operations in the NAND flash memory device of FIG. 1A.

Referring to FIG. 1A, in a memory block, both ends of a memory cell are connected to a drain selection transistor DST supplied with a voltage through a single drain selection line DSL, and a source selection transistor SST supplied with a voltage through a single source selection line SSL. The source selection transistor SST is also coupled to a common source line CSL.

Hereinafter, it will be described about the voltage conditions of the programming and reading operations with reference to FIGS. 1A and 1B.

A selected bitline BL1 to be programmed is set to 0V, as shown in FIG. 1B, while a gate of the drain selection transistor DST is set to a power source voltage VCC through the drain selection line DSL. Then, a channel of a memory cell coupled to the bitline BL1 to be programmed is kept open and maintained at 0V. In this condition, if a program voltage Vpgm is applied to a memory cell through a selected wordline WL, the tunnel oxide film of the selected memory cell is charged with a high voltage to conduct the programming operation.

However, as a deselected bitline BL2 not to be programmed is coupled to the power source voltage VCC with the same drain selection transistor DST, the channel voltage of deselected bitline BL2 increases because the drain selection transistor DST is turned on when the channel voltage of the memory cell rises over VCC–Vt (Vt is a threshold voltage of the drain selection transistor DST). Thus, a memory connected to the wordline of the memory cell to be programmed is not programmed because the voltage applied to the tunnel oxide film decreases due to the channel voltage elevation.

In the reading operation, a voltage of 4.5V is applied to the gate of the drain selection transistor DST through the drain selection line DSL, and the voltage of 4.5 V is also applied to a gate of the source selection transistor SST through the source selection line SSL. The common source line CSL is supplied with 0V. 1V is applied to a bitline selected for the reading operation, while 0V is applied to a deselected bitline. Then, the drain selection transistor DST and the source selection transistor SST are kept on to make current flow depending on a read condition of the selected memory cell. 0V is applied to BULK during the programming and reading operations.

As stated above, since the single block has the drain selection transistors DST supplied with a voltage through the single drain selection line DSL, the source selection transistors SST supplied with the single source selection line SSL, and the source selection transistors SST are coupled to the common source line CSL, the chip size of the flash memory device may become increasingly large.

BRIEF SUMMARY OF THE INVENTION

The present invention is directed to a nonvolatile memory device and method of programming/reading the same, reducing a chip size by sharing source selection transistors to which a voltage is applied through a source selection line for a dual-memory block without a common source line.

An aspect the present invention is to provide a nonvolatile memory device including a group of memory blocks, in which each dual-memory block of the entire group of memory blocks share a source selection transistor supplied with a voltage through a source selection line.

According to an embodiment, a first memory block of the dual-memory block is coupled to a first bitline while a second memory block of the dual-memory block is coupled to a second bitline. The second bitline of the second memory block is used as a common source line when the first memory block is being programmed and read, while the first bitline of the first memory block is used as the common source line when the second memory block is being programmed and read.

According to an embodiment, the second bitline of the second memory block is used as a common source line and supplied with a ground voltage, when the first memory block is being programmed and read, while the first bitline of the first memory block is used as the common source line and supplied with a ground voltage, when the second memory block is being programmed and read.

According to an embodiment, the source selection line is supplied with a ground voltage when the first or second memory block is to be programmed, while the source selection line is supplied with 4.5V (or at least 3 V) when the first or second memory block is to be read.

According to an embodiment, the first and second memory blocks each include a group of wordlines and drain selection lines. The wordlines and the drain selection lines of the second memory block are supplied with a ground voltage when the first memory block is to be programmed, while the wordlines and the drain selection lines of the first memory block are supplied with a ground voltage when the second memory block is to be programmed.

According to an embodiment, the wordlines and the drain selection lines of the second memory block are supplied with 4.5V when the first memory block is to be read, while the wordlines and the drain selection lines of the first memory block are supplied with 4.5V when the second memory block is to be read.

In another aspect of the present invention, a method of programming and reading a nonvolatile memory device including group of memory blocks comprises the steps of: sharing a source transistor supplied with a voltage through a source selection line for a group of dual-memory blocks; connecting a first memory block of the dual-memory block to a first bitline while connecting a second memory block of the dual-memory block to a second bitline; and programming and reading the first memory block with using the second bitline of the second memory block as a common source line, or programming and reading the second memory block with using the first bitline of the first memory block as a common source line.

In this method, the step of programming and reading includes applying a ground voltage to the first or second bitline, where the bitline supplied with the ground voltage is used as the common source line.

In this method, the step of programming and reading includes applying a ground voltage to the source selection line when the first or second memory block is to be programmed, while applying 4.5V to the source selection line when the first or second memory block is to be read.

The invention also provides a nonvolatile memory device including a group of memory blocks, wherein every two memory blocks form a dual-memory block, each dual-memory block sharing a source selection transistor supplied with a voltage through a source selection line. A first memory block of the -dual memory block is coupled to first and second bitlines while a second memory block of the dual-memory block is coupled to third and fourth bitlines. The first and second bitlines include a first metal while the third and fourth bitlines include a second metal.

According to an embodiment, the third bitline of the second metal is interposed between the first and second bitlines of the first metal, while the second bitline of the first metal is interposed between the third and fourth bitlines of the second metal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIG. 1B is a chart showing voltage conditions during programming and reading operations in the NAND flash memory device of FIG. 1A;

FIG. 2B is a chart showing voltage conditions during programming and reading operations in the NAND flash memory device of FIG. 2A.

DETAILED DESCRIPTION OF THE INVENTION

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 1A:
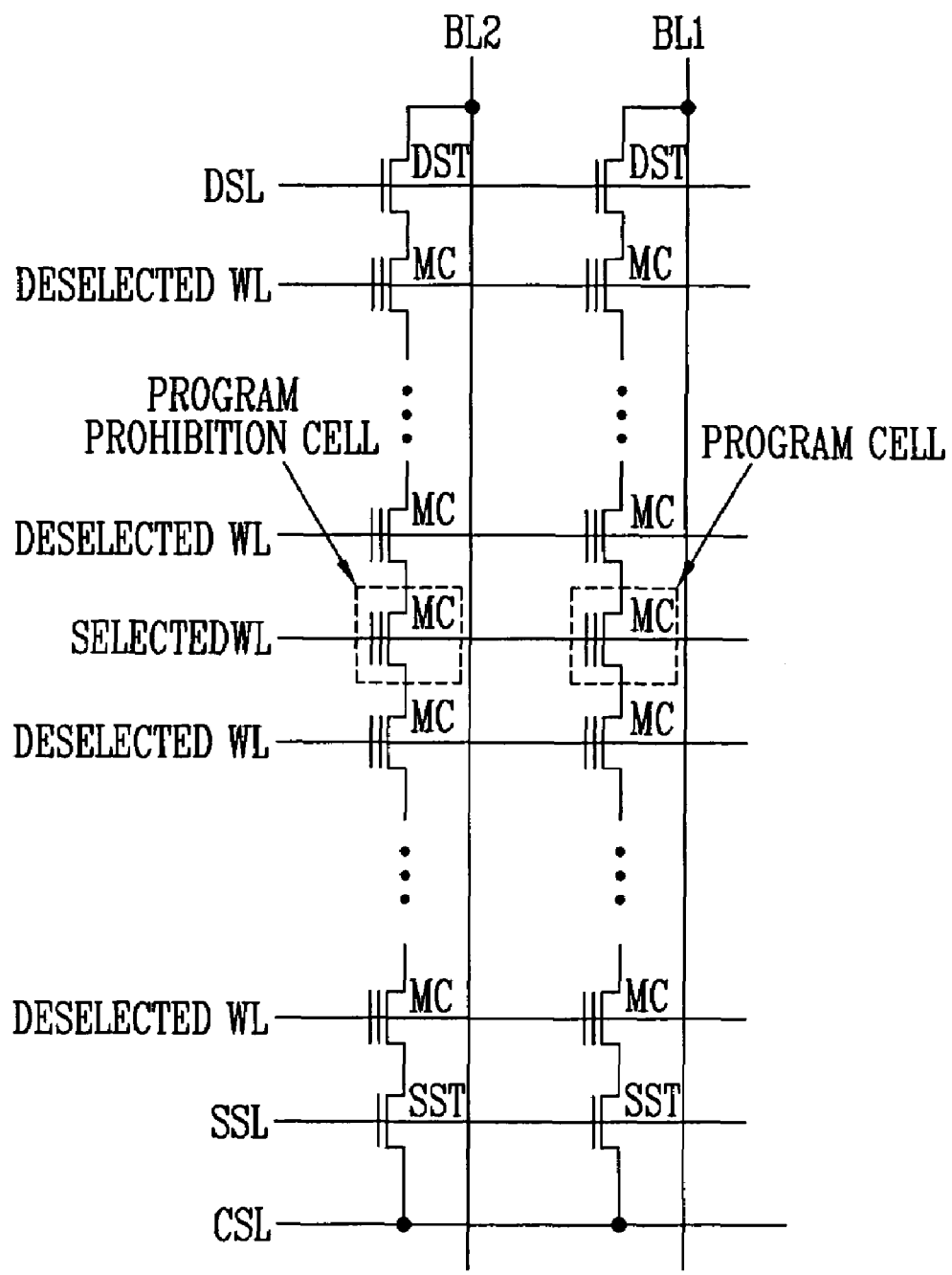
FIG. 1A is a circuit diagram of a conventional NAND flash memory device.
Figure 2A:
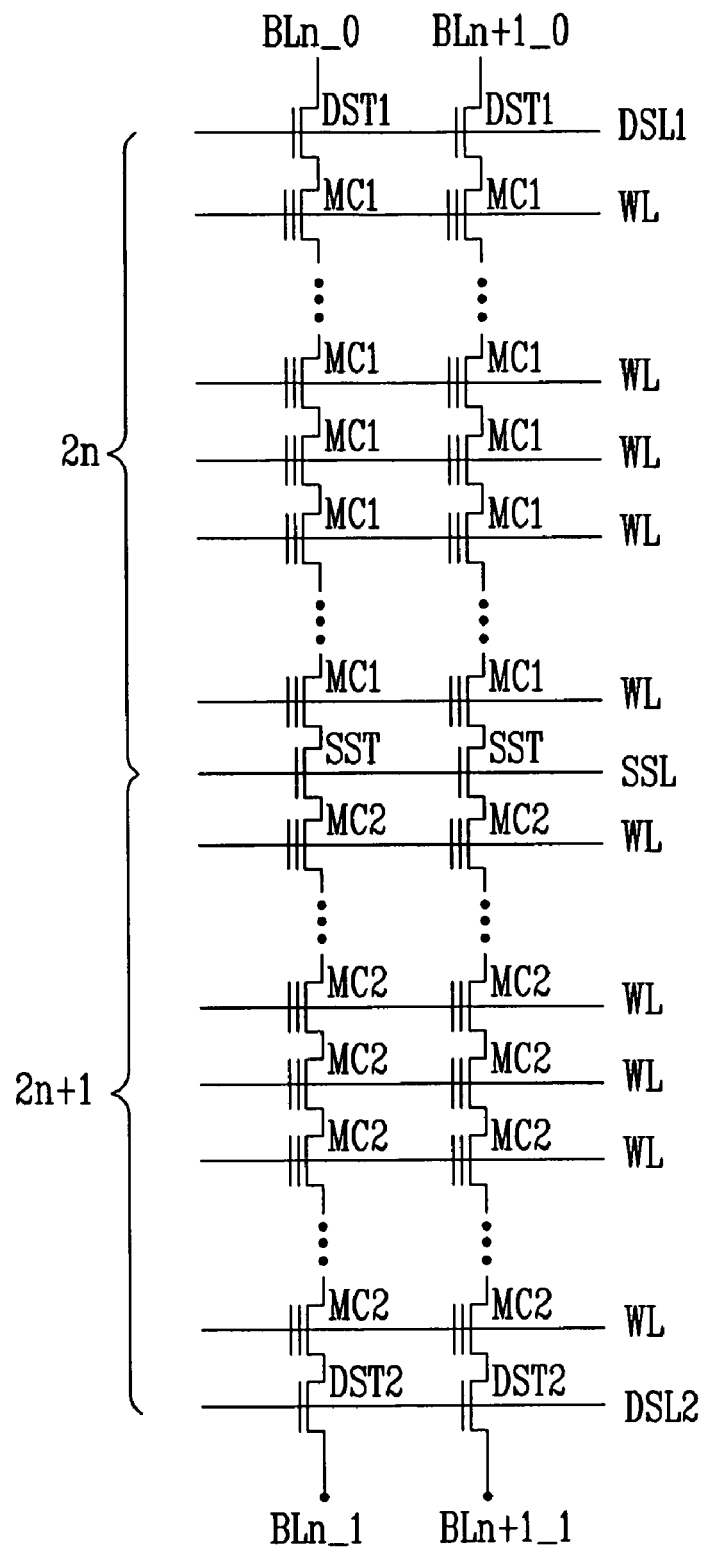
FIG. 2A is a circuit diagram illustrating a NAND flash memory device in accordance with one embodiment of the invention.

FIG. 2A is a circuit diagram illustrating a NAND flash memory device in accordance with one embodiment of the invention, FIG. 2B is a chart showing voltage conditions during programming and reading operations in the NAND flash memory device of FIG. 2A.

Referring to FIG. 2A, the NAND flash memory device includes a first memory block $2n$ and second memory block $2n+1$. The first memory block $2n$ and the second memory block $2n+1$ share a source selection transistor SST to which a voltage is applied through a source selection line SSL.

Here, the first memory block $2n$ includes drain selection transistors DST1 and memory cells MC1. The drain selection transistors DST1 are supplied with a voltage through a first drain selection line DSL1 and at least one terminal of the drain selection transistors DST1 are coupled to bitlines BLn_0 and BLn+1_0. The second memory block $2n+1$ includes drain selection transistors DST2 and memory cells MC2. The drain selection transistors DST2 are supplied with a voltage through a second drain selection line DSL2 and at least one terminal of the drain selection transistors DST2 are coupled to bitlines BLn_1 and BLn+1_1.

First, in the operation of programming the first memory block $2n$, the bitlines BLn_1 and BLn+1_1 of the second memory block $2n+1$ act as a common source line CSL. In the operation of programming the second memory block $2n+1$, the bitlines BLn_0 and BLn+1_0 of the first memory block $2n$ act as a common source line CSL. For instance, in programming the first memory block $2n$, if the bitline BLn_0 is selected to be programmed, the bitlines BLn_1 and BLn+1_1 are supplied with 0V or the power source voltage VCC for functioning as a common source line CSL. While in a programming operation, the common source line CSL is supplied with the power source voltage VCC in order to reduce leakage current through the source line. It should be appreciated that while 0V is applied to the bitlines, the source selection transistor SST has a threshold voltage of about 0.7V. In programming the first memory block $2n$, 0V is applied to the wordline WL and the second drain selection line DSL2 of the memory block $2n+1$. Other programming voltage conditions for the first memory block $2n$ are as same as that of the conventional case of the memory block.

Next, in the operation of reading the first memory block $2n$, the bitlines BLn_1 and BLn+1_1 of the second memory block $2n+1$ act as a common source line CSL. In the operation of reading the second memory block $2n+1$, the bitlines BLn_0 and BLn+1_0 of the first memory block $2n$ act as a common source line CSL. For instance, in reading the first memory block $2n$, if the bitline BLn_0 is selected to be read, the bitlines BLn_1 and BLn+1_1 are supplied with 0V while 4.5V is applied to each wordline and the second drain selection line DSL2. Other reading voltage conditions for the first memory block $2n$ is as same as that of the conventional case of the memory block. 0V is applied to BULK during the operations of programming and reading.

With the programming and reading operations in the aforementioned voltage conditions, it is possible to share the source selection transistor SST to which the voltage is applied through the source selection line SSL in a dual-memory block.

Figure 3:
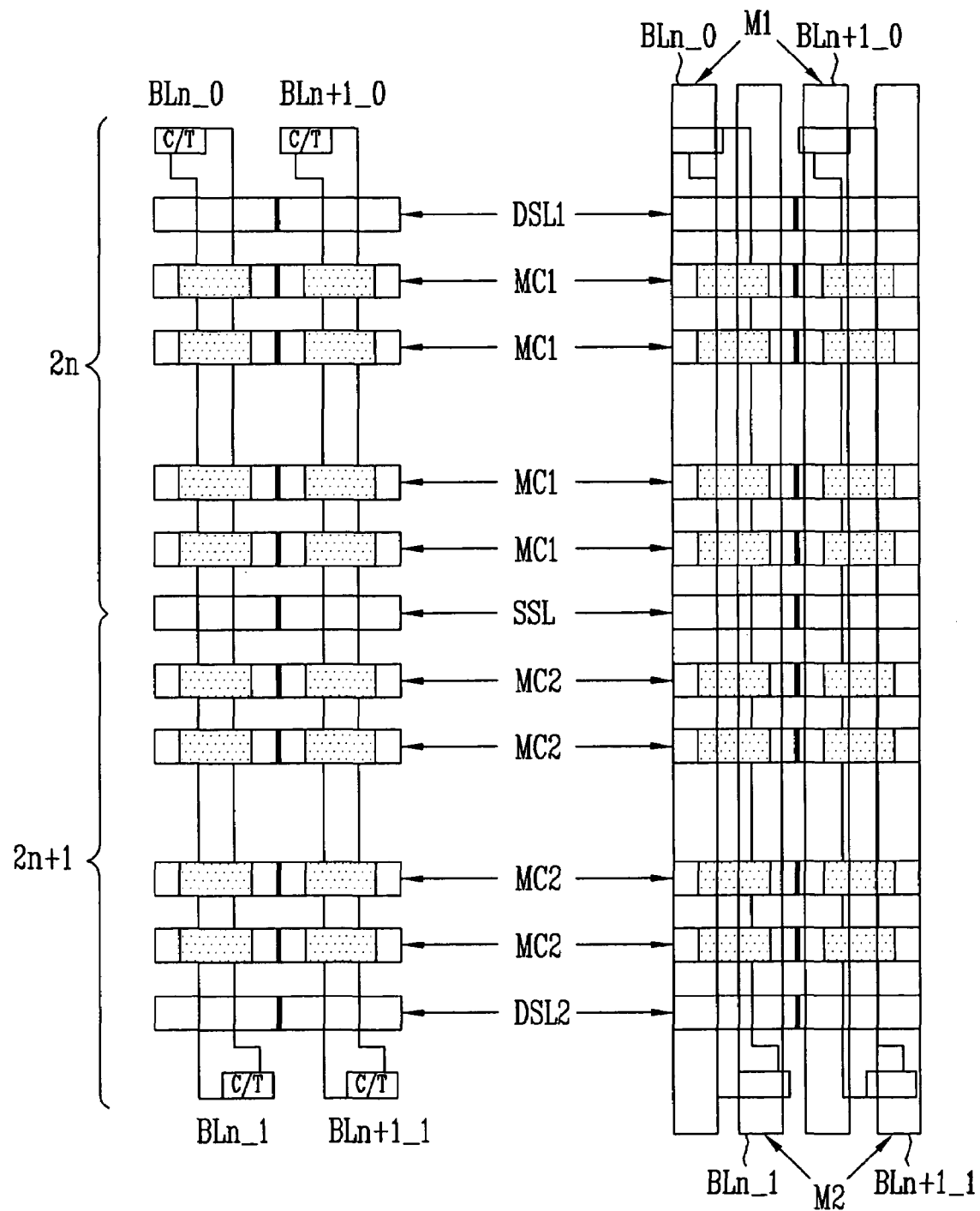
FIG. 3 is a diagram illustrating the arrangement of bitlines in the NAND flash memory device of FIG. 2A.

FIG. 3 is a diagram illustrating the arrangement of bitlines in the NAND flash memory device of FIG. 2A.

Referring to FIG. 3, the bitlines BLn_0 and BLn+1_0 include a first metal M1 while the bitlines BLn_1 and BLn+1_1 include a second metal M2. The bitline BLn_1 including the second metal M2 is interposed between the bitlines BLn_0 and BLn+1_0 including the first metal M1, while the bitline BLn+1_0 including the first metal M1 is interposed between the bitlines BLn_1 and BLn+1_1 including the second metal M2.

The bitline structure is formed with different metals because it is difficult to efficiently construct the bitlines with appropriate pitches if all the bitlines are formed of the same metal. With the aforementioned bitline structure such as the bitlines BLn_0 and BLn+1_0 of the first metal M1 and the bitlines BLn_1 and BLn+1_1 of the second metal M2, it is possible to implement the contact structure of the common source line just by adjusting sizes of contacts and the first metal M1.

Although the present invention has been described in connection with the embodiment of the present invention illustrated in the accompanying drawings, it is not limited thereto. It will be apparent to those ordinary skilled in the art that various substitution, modifications and changes may be thereto without departing from the scope and spirit of the invention.

As aforementioned, the present invention is advantageous to reducing a chip size of the flash memory device by sharing the source selection transistor in two memory blocks, without the convention common source line CSL. Thus, there is an advantage of increasing the number of net dies and thereby reducing a product cost.

In addition, the present invention uses the bitlines as the common source line. As a result, it reduces noises of the reading operation due to resistance, providing a more reliable reading operation.

What is claimed is:

1. A nonvolatile memory device comprising:
    a first bitline group having a plurality of first bitlines;
    a plurality of source selection transistors, wherein a gate of each source selection transistor is coupled to a source selection line;
    a first memory block provided between the first bitline group and the source selection transistors;
    a plurality of first drain selection transistors coupled between the first bitline group and the first memory block, wherein a gate of each first drain selection transistor is coupled to a first drain selection line;
    a second bitline group having a plurality of second bitlines that are different from the first bitlines;
    a second memory block provided between the second bitline group and the source selection transistors; and
    a plurality of second drain selection transistors, wherein a gate of each second drain selection transistor is coupled to a second drain selection line, one terminal of each second drain selection transistor being coupled to each second bitline of the second bitline group and another terminal of each second drain selection transistor being coupled to the second memory block,
    wherein in the event that the first memory block is selected, the first memory block uses the second bitline group as a common source line, and
    wherein in the event that the second memory block is selected, the second memory block uses the first bitline group as a common source line.

2. The nonvolatile memory device as set forth in claim 1, wherein one of the plurality of second bitlines in the second bitline group is used as a common source line when the first memory block is being programmed, wherein one of the plurality of first bitlines in the first bitline group is used as the common source line when the second memory block is being programmed.

3. The nonvolatile memory device as set forth in claim 2, wherein one of the plurality of second bitlines in the second bitline group is used as a common source line and supplied with a ground voltage when the first memory block is being programmed, wherein one of the plurality of first bitlines in the first bitline group is used as the common source line and supplied with a ground voltage when the second memory block is being programmed.

4. The nonvolatile memory device as set forth in claim 2, wherein the source selection line is supplied with a ground voltage when the first or second memory block is to be programmed and the source selection line is supplied with a voltage when the first or second memory block is to be read.

5. The nonvolatile memory device as set forth in claim 2, wherein each of the first and second memory blocks is coupled to a plurality of wordlines and drain selection lines,
    wherein the plurality of wordlines and the drain selection lines of the second memory block are supplied with a ground voltage when the first memory block is to be programmed, wherein the plurality of wordlines and the drain selection lines of the first memory block are supplied with a ground voltage when the second memory block is to be programmed.

6. The nonvolatile memory device as set forth in claim 5, wherein the plurality of wordlines and the drain selection lines of the second memory block are supplied with a voltage when the first memory block is to be read, wherein the plurality of wordlines and the drain selection lines of the first memory block are supplied with the voltage when the second memory block is to be read.

7. A method for operating a nonvolatile memory device including a dual-memory block, the method comprising:
    providing a given voltage to the dual-memory block via a source selection transistor, the given voltage being received by a gate of the source selection transistor from a source selection line, the dual block including first and second memory blocks that share the source selection transistor;
    coupling the first memory block of the dual-memory block to a first bitline group having a plurality of first bitlines;
    coupling a first drain selection transistor between the first bitline group and the first memory block, wherein a gate of the first drain selection transistor is coupled to a first drain selection line;
    coupling a second memory block of the dual-memory block to a second bitline group having a plurality of second bitlines different from the first bitlines, so that the first and second memory blocks are coupled to the first bitline group and the second bitline group, respectively, at the same time, wherein a column in the dual-memory block comprises a bitline of the first bitline group and a bitline of the second bitline group;
    coupling a gate of a second drain selection transistor to a second drain selection line, one terminal of the second drain selection transistor being coupled to the second bitline of the second bitline group and another terminal of the second drain selection transistor being coupled to the second memory block;
    programming the first memory block using the second bitline group coupled to the second memory block as a common source line; and
    programming the second memory block using the first bitline group coupled to the first memory block as a common source line.

8. The method as set forth in claim 7, wherein the step of programming the first memory block includes applying a ground voltage to the second bitline group.

9. The method as set forth in claim 7, wherein the step of programming includes applying a ground voltage to the source selection line when the first memory block is to be programmed; and applying a predetermined voltage that is at least 3V to the source selection line when the first memory block is to be read.

* * * * *